US009872401B2

(12) United States Patent
Tomikawa et al.

(10) Patent No.: US 9,872,401 B2
(45) **Date of Patent: *Jan. 16, 2018**

(54) CIRCUIT SUBSTRATE AND METHOD FOR MANUFACTURING THE SAME

(71) Applicant: IBIDEN CO., LTD., Ogaki (JP)

(72) Inventors: Mitsuhiro Tomikawa, Ogaki (JP); Koji Asano, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 32 days.

This patent is subject to a terminal disclaimer.

(21) Appl. No.: 14/791,641

(22) Filed: Jul. 6, 2015

(65) Prior Publication Data

US 2016/0007451 A1 Jan. 7, 2016

(30) Foreign Application Priority Data

Jul. 3, 2014 (JP) ................................ 2014-137450

(51) Int. Cl.
*H05K 1/18* (2006.01)
*H05K 1/16* (2006.01)
(Continued)

(52) U.S. Cl.
CPC ....... *H05K 3/4602* (2013.01); *H01L 23/3735* (2013.01); *H01L 24/19* (2013.01);
(Continued)

(58) Field of Classification Search
CPC . H05K 2201/10416; H05K 2201/1056; H05K 2201/2072; H05K 1/185
See application file for complete search history.

(56) References Cited

U.S. PATENT DOCUMENTS 4,835,598 A † 5/1989 Higuchi
6,459,585 B1 * 10/2002 Bergstedt ............ H05K 1/0204 361/702
(Continued)

FOREIGN PATENT DOCUMENTS

JP 2013-135168 † 7/2013

OTHER PUBLICATIONS

U.S. Appl. No. 14/791,735, filed Jul. 6, 2015, Tomikawa, et al.
(Continued)

*Primary Examiner* — Chau N Nguyen
*Assistant Examiner* — Roshn Varghese
(74) *Attorney, Agent, or Firm* — Oblon, McClelland, Maier & Neustadt, L.L.P.

(57) ABSTRACT

A circuit substrate includes a core substrate having cavity penetrating through the core substrate, a metal block accommodated in the cavity of the core substrate, a first build-up layer including an insulating layer and laminated on first side of the core substrate such that the first build-up layer is covering the cavity on the first side of the core substrate, and a second build-up layer including an insulating layer and laminated on second side of the core substrate such that the second build-up layer is covering the cavity on the second side of the core substrate, and a filling resin filling gap formed between the cavity and block positioned in the cavity of the core substrate. The block has roughened surfaces such that the roughened surfaces are in contact with the insulating layers in the first and second build-up layers on the first and second sides of the core substrate.

20 Claims, 11 Drawing Sheets

(51) Int. Cl.

| | |
|---|---|
| ***H05K 3/46*** | (2006.01) |
| ***H05K 1/02*** | (2006.01) |
| ***H01L 23/00*** | (2006.01) |
| ***H01L 23/373*** | (2006.01) |
| *H05K 1/11* | (2006.01) |
| *H01L 21/56* | (2006.01) |
| *H01L 25/10* | (2006.01) |
| *H01L 23/498* | (2006.01) |

(52) U.S. Cl.

CPC .............. *H01L 24/25* (2013.01); *H01L 24/32* (2013.01); *H01L 24/48* (2013.01); *H01L 24/73* (2013.01); *H05K 1/0204* (2013.01); *H01L 21/568* (2013.01); *H01L 23/49816* (2013.01); *H01L 23/49822* (2013.01); *H01L 23/49827* (2013.01); *H01L 25/105* (2013.01); *H01L 2224/04105* (2013.01); *H01L 2224/12105* (2013.01); *H01L 2224/16227* (2013.01); *H01L 2224/2518* (2013.01); *H01L 2224/32225* (2013.01); *H01L 2224/48091* (2013.01); *H01L 2224/48227* (2013.01); *H01L 2224/73265* (2013.01); *H01L 2225/1023* (2013.01); *H01L 2225/1058* (2013.01); *H01L 2225/1094* (2013.01); *H01L 2924/00014* (2013.01); *H01L 2924/15331* (2013.01); *H01L 2924/181* (2013.01); *H01L 2924/19105* (2013.01); *H05K 1/115* (2013.01); *H05K 3/4644* (2013.01); *H05K 2201/0187* (2013.01); *H05K 2201/09536* (2013.01); *H05K 2201/09827* (2013.01); *H05K 2201/09854* (2013.01); *H05K 2201/10416* (2013.01); *H05K 2201/10734* (2013.01); *H05K 2203/0307* (2013.01)

(56) References Cited

U.S. PATENT DOCUMENTS

| | | | | |
|---|---|---|---|---|
| 9,433,097 | B2 * | 8/2016 | Tomikawa | H05K 1/0204 |
| 2004/0226745 | A1 * | 11/2004 | En | C25D 3/38 174/262 |
| 2005/0067378 | A1 † | 3/2005 | Fuerhaupter | |
| 2008/0000680 | A1 * | 1/2008 | Cho | H01L 23/5389 174/262 |
| 2009/0242257 | A1 * | 10/2009 | Kakei | H05K 1/162 174/260 |
| 2010/0065323 | A1 * | 3/2010 | Kawamura | B23K 3/0623 174/263 |
| 2010/0200277 | A1 * | 8/2010 | Huang | H05K 1/0204 174/252 |
| 2010/0214752 | A1 † | 8/2010 | Shimizu | |
| 2013/0027896 | A1 * | 1/2013 | Lee | H05K 1/185 361/761 |
| 2013/0228362 | A1 * | 9/2013 | Berkel | H05K 1/0204 174/252 |
| 2013/0269986 | A1 * | 10/2013 | Sun | H05K 1/0204 174/252 |
| 2014/0144677 | A1 * | 5/2014 | Wang | H05K 1/0206 174/252 |
| 2016/0021753 | A1 * | 1/2016 | Tomikawa | H05K 3/4697 361/761 |
| 2016/0242293 | A1 * | 8/2016 | Mikado | H05K 1/183 |

OTHER PUBLICATIONS

U.S. Appl. No. 14/802,139, filed Jul. 17, 2015, Tomikawa, et al.
Surface Rougness, Jun. 19, 2014, Wikipedia, https://en.wikipedia.org/w/index.php?title=Surface_rougness&oldid=613496976.†

* cited by examiner
† cited by third party

CIRCUIT SUBSTRATE AND METHOD FOR MANUFACTURING THE SAME

CROSS-REFERENCE TO RELATED APPLICATIONS

The present application is based upon and claims the benefit of priority to Japanese Patent Application No. 2014-137450, filed Jul. 3, 2014, the entire contents of which are incorporated herein by reference.

BACKGROUND OF THE INVENTION

Field of the Invention

The present invention relates to a circuit substrate in which a build-up layer is laminated on a core substrate that has a cavity, and to a method for manufacturing the circuit substrate.

Description of Background Art

Japanese Patent Laid-Open Publication No. 2013-135168 describes a circuit substrate in which both front and back surfaces of a metal block accommodated in a cavity are fixed by insulating resin layers in build-up layers. The entire contents of this publication are incorporated herein by reference.

SUMMARY OF THE INVENTION

According to one aspect of the present invention, a circuit substrate includes a core substrate having a cavity penetrating through the core substrate, a metal block accommodated in the cavity of the core substrate, a first build-up layer including an insulating resin layer and laminated on a first side of the core substrate such that the first build-up layer is covering the cavity on the first side of the core substrate, and a second build-up layer including an insulating resin layer and laminated on a second side of the core substrate such that the second build-up layer is covering the cavity on the second side of the core substrate, and a filling resin filling a gap formed between the cavity and the metal block positioned in the cavity of the core substrate. The metal block has roughened surfaces such that the roughened surfaces are in contact with the insulating resin layers in the first and second build-up layers on the first and second sides of the core substrate, respectively.

According to another aspect of the present invention, a method for manufacturing a circuit substrate includes forming a cavity in a core substrate such that the cavity penetrates through the core substrate, accommodating a metal block in the cavity of the core substrate, filling a filling resin into a gap formed between the cavity and the metal block such that the metal block is positioned in the cavity of the core substrate, forming a first build-up layer including an insulating resin layer on a first side of the core substrate such that the first build-up layer covers the cavity on the first side of the core substrate, and forming a second build-up layer including an insulating resin layer on a second side of the core substrate such that the second build-up layer covers the cavity on the second side of the core substrate. The metal block has roughened surfaces such that the roughened surfaces are in contact with the insulating resin layers in the first and second build-up layers on the first and second sides of the core substrate, respectively.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
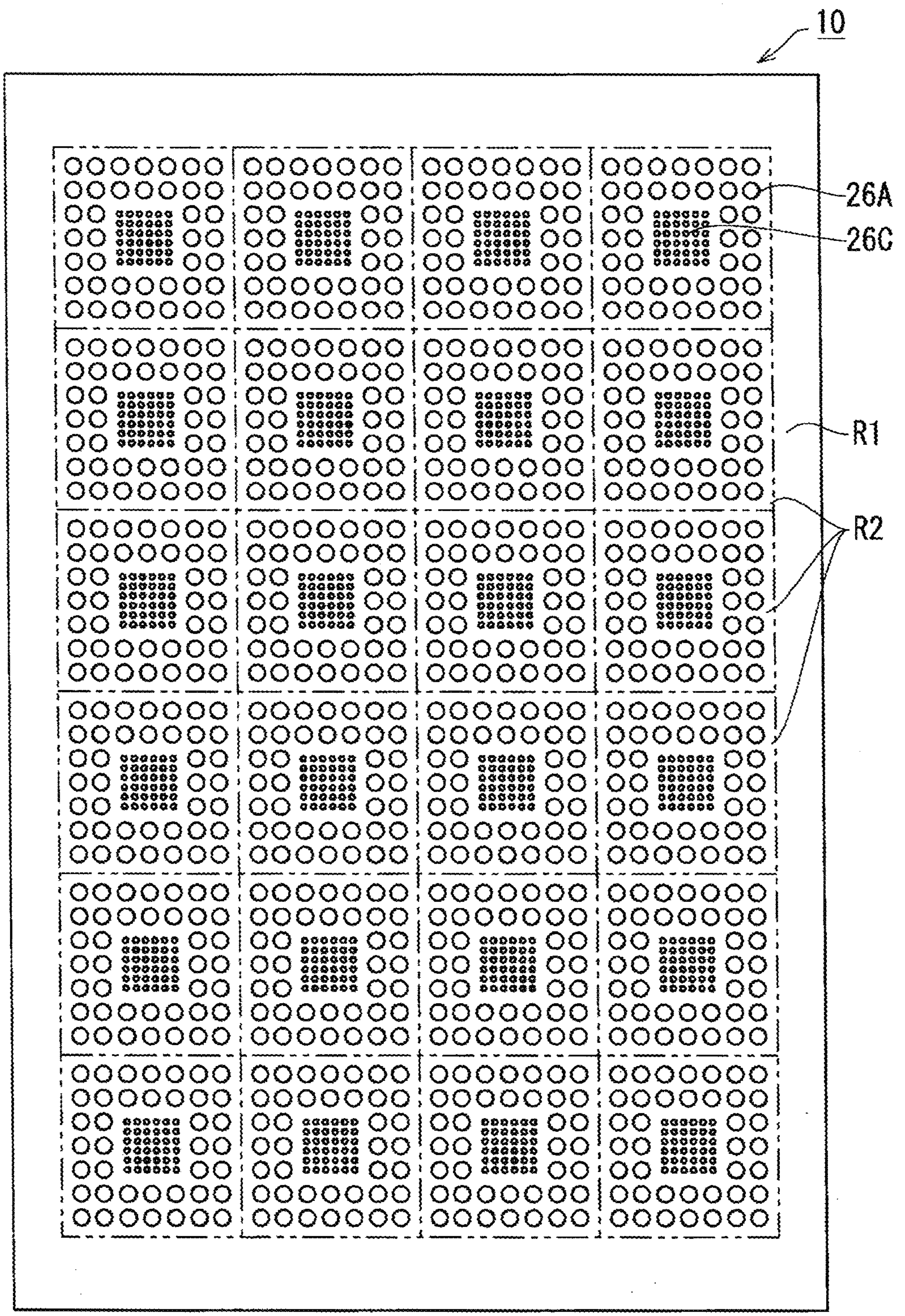
FIG. 1 is a plan view of a circuit substrate according to a first embodiment of the present invention.

The embodiments will now be described with reference to the accompanying drawings, wherein like reference numerals designate corresponding or identical elements throughout the various drawings.

First Embodiment

Figure 2:
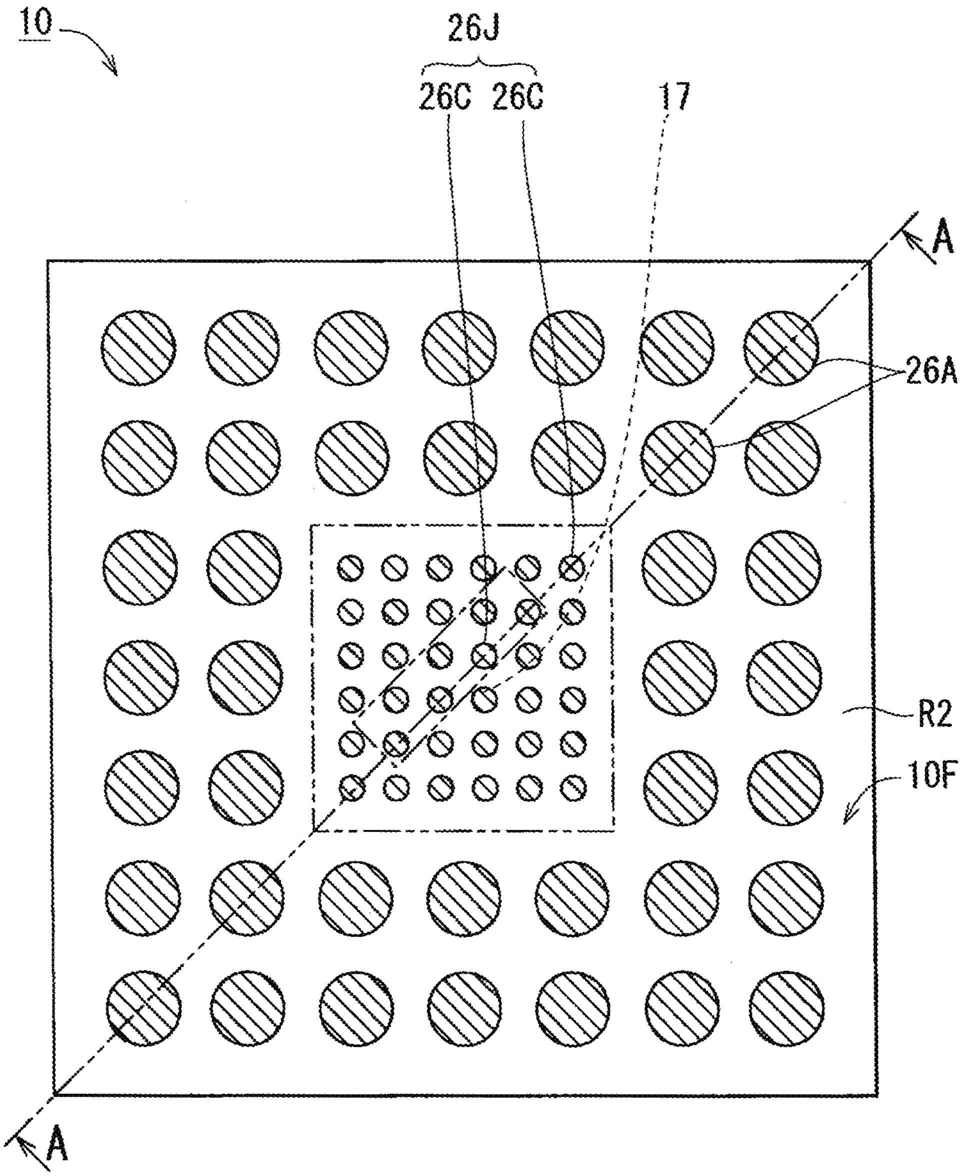
FIG. 2 is a plan view of a product region in the circuit substrate.
Figure 3:
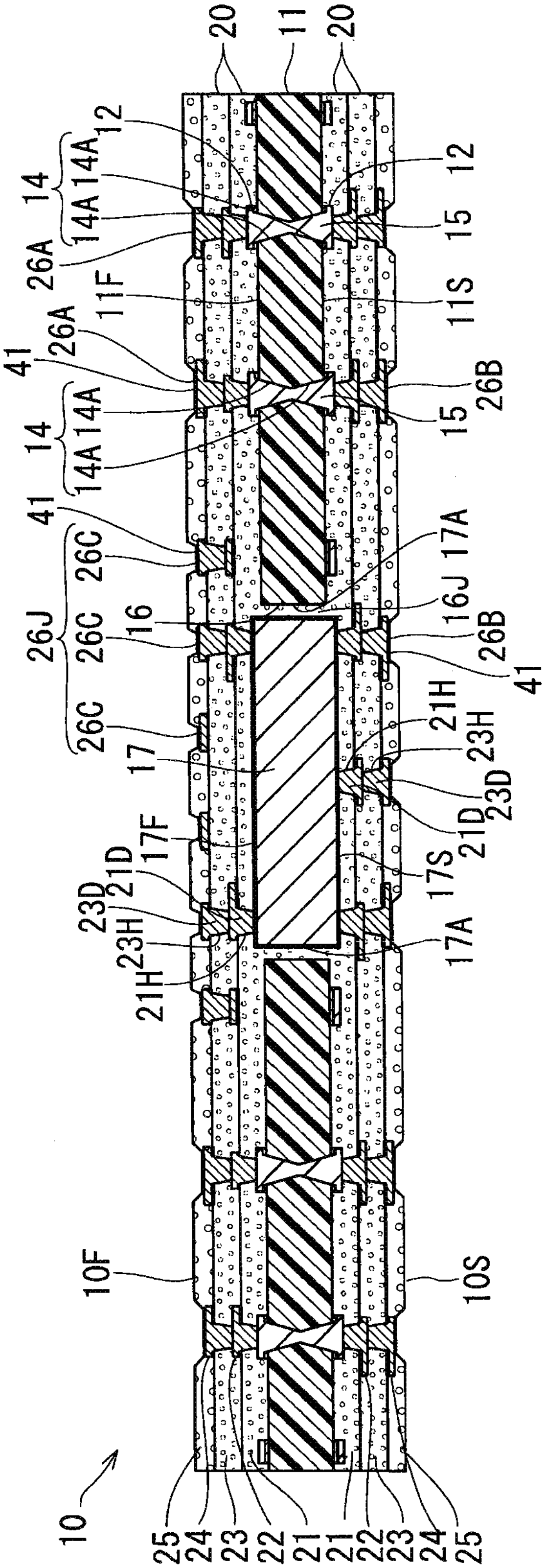
FIG. 3 is cross-sectional side view of the circuit substrate in an A-A cutting plane of FIG. 2.

In the following, a first embodiment of the present invention is described based on FIG. 1-10. As illustrated in a plan view of FIG. 1, a circuit substrate 10 of the present embodiment has, for example, a frame-shaped discard region (R1) along an outer edge, and an inner side of the discard region (R1) is divided into multiple square product regions (R2). FIG. 2 illustrates an enlarged view of one product region (R2). FIG. 3 illustrates an enlarged view of a cross-sectional structure of the circuit substrate 10, the cross section being taken by cutting the product region (R2) along a diagonal line.

As illustrated in FIG. 3, the circuit substrate 10 is structured to have build-up layers 20, 20 on both front and back surfaces of a core substrate 11. The core substrate 11 is formed of an insulating member. A conductor circuit layer 12 is formed on each of an F surface (11F), which is the front side surface of the core substrate 11, and an S surface (11S), which is the back side surface of the core substrate 11. Further, a cavity 16 and multiple electrical conduction through holes 14 are formed in the core substrate 11.

The electrical conduction through holes 14 are each formed in a middle-constricted shape in which small diameter side ends of tapered holes (14A, 14A) are communicatively connected, the tapered holes (14A, 14A) being respective formed by drilling from the F surface (11F) and the S surface (11S) of the core substrate 11 and being gradually reduced in diameter toward a deep side. On the other hand, the cavity 16 is formed in a shape that has a space in a shape of a rectangular cuboid.

The electrical conduction through holes 14 are filled with plating and multiple through-hole electrical conductors 15 are respectively formed. The conductor circuit layer 12 on the F surface (11F) and the conductor circuit layer 12 on the S surface (11S) are connected by the through-hole electrical conductors 15.

A metal block 17 is accommodated in the cavity 16. The metal block 17 is, for example, a copper cuboid. A planar shape of the metal block 17 is slightly smaller than a planar shape of the cavity 16. Further, a thickness of the metal block 17, that is, a distance between a first primary surface (17F) (which is one of front and back surfaces of the metal block 17) and a second primary surface (17S) (which is the other one of the front and back surfaces of the metal block 17), is slightly larger than a plate thickness of the core substrate 11. The metal block 17 slightly protrudes from both the F surface (11F) and the S surface (11S) of the core substrate 11. The first primary surface (17F) of the metal block 17 is substantially flush with an outermost surface of the conductor circuit layer 12 on the F surface (11F) of the core substrate 11, and the second primary surface (17S) of the metal block 17 is substantially flush with an outermost surface of the conductor circuit layer 12 on the S surface (11S) of the core substrate 11. Further, a gap between the metal block 17 and an inner surface of the cavity 16 is filled with a filling resin (16J) according to an embodiment of the present invention.

The first primary surface (17F) and the second primary surface (17S) of the metal block 17, and four side surfaces (17A) between the first primary surface (17F) and second primary surface (17S) (that is, all outer surfaces of the metal block 17) are roughened surfaces. Specifically, the metal block 17 is immersed in an acid solution (for example, an acid of which main components are sulfuric acid and hydrogen peroxide) for a predetermined time period to erode the surfaces and thereby the surfaces of the metal block 17 have an arithmetic average roughness (Ra) of 0.1 μm-3.0 μm (according to a definition of JIS B 0601-1994).

Both the build-up layer 20 on the F surface (11F) side of the core substrate 11 and the build-up layer 20 on the S surface (11S) side are formed by sequentially laminating, from the core substrate 11 side, a first insulating resin layer 21, a first conductor layer 22, a second insulating resin layer 23 and a second conductor layer 24. A solder resist layer 25 is laminated on the second conductor layer 24. Further, multiple via holes (21H) and multiple via holes (23H) are respectively formed in the first insulating resin layer 21 and the second insulating resin layer 23. The via holes (21H, 23H) are all formed in a tapered shape that is gradually reduced in diameter toward the core substrate 11 side. Further, the via holes (21H, 23H) are filled with plating and multiple via conductors (21D, 23D) are formed. Then, the conductor circuit layer 12 and the first conductor layer 22, and, the metal block 17 and the first conductor layer 22, are connected by the via conductors (21D) of the first insulating resin layer 21; and the first conductor layer 22 and the second conductor layer 24 are connected by the via conductors (23D) of the second insulating resin layer 23. Further, multiple pad holes are formed in the solder resist layer 25, and a portion of the second conductor layer 24 positioned in each of the pad holes becomes a pad 26.

On an F surface (10F) of the circuit substrate 10 (the F surface (10F) being an outermost surface of the build-up layer 20 on the F surface (11F) of the core substrate 11), the pads 26 include a group of large pads (26A) that are arranged in two rows along an outer edge of the product region (R2) and a group of small pads (26C) that are arranged in multiple vertical and horizontal rows in an inner side region surrounded by the group of the large pads (26A). Further, an electronic component mounting part (26J) according to an embodiment of the present invention is formed from the group of the small pads (26C). Further, for example, as illustrated in FIG. 2, the metal block 17 is arranged at a position directly below a total of seven small pads (26C) including four small pads (26C) that are aligned on a diagonal line of the product region (R2) at a center of the group of the small pads (26C) and three small pads (26C) that are aligned parallel to the diagonal line next to the array of the four small pads (26C). Then, among the seven small pads (26C), as illustrated in FIG. 3, for example, two small pads (26C) are connected to the metal block 17 via four via conductors (21D, 23D). In contrast, on an S surface (10S) of the circuit substrate 10 (the S surface (10S) being an outermost surface of the build-up layer 20 on the S surface (11S) of the core substrate 11), three medium pads (26B) that are larger than the small pads (26C) form a substrate connecting part according to an embodiment of the present invention, and are connected to the metal block 17 via six via conductors (21D, 23D). That is, in the circuit substrate 10 of the present embodiment, the number of the via conductors (21D) that are connected to the metal block 17 is greater in the build-up layer 20 on the S surface (11S) side of the core substrate 11 than in the build-up layer 20 on the F surface (11F) side.

The circuit substrate 10 of the present embodiment is manufactured as follows.

Figure 4A:
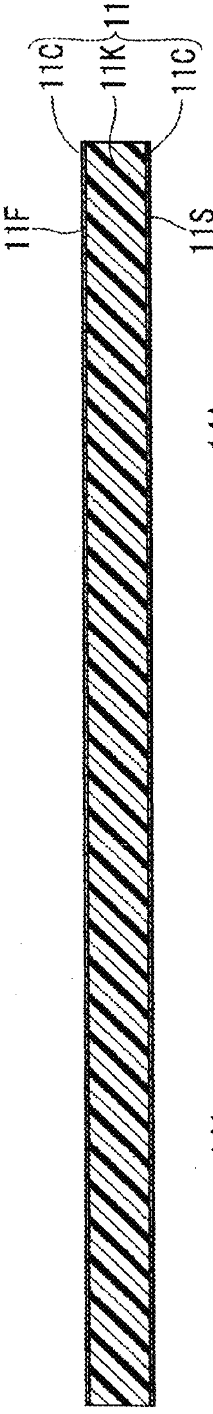
FIG. 4A-4D are cross-sectional side views illustrating manufacturing processes of the circuit substrate.

(1) As illustrated in FIG. 4A, a substrate as the core substrate 11 is prepared that is obtained by laminating a copper foil (11C) on each of both front and back surfaces of an insulating base material (11K) that is made of epoxy resin or BT (bismaleimide triazine) resin and a reinforcing material such as a glass cloth.

Figure 4B:
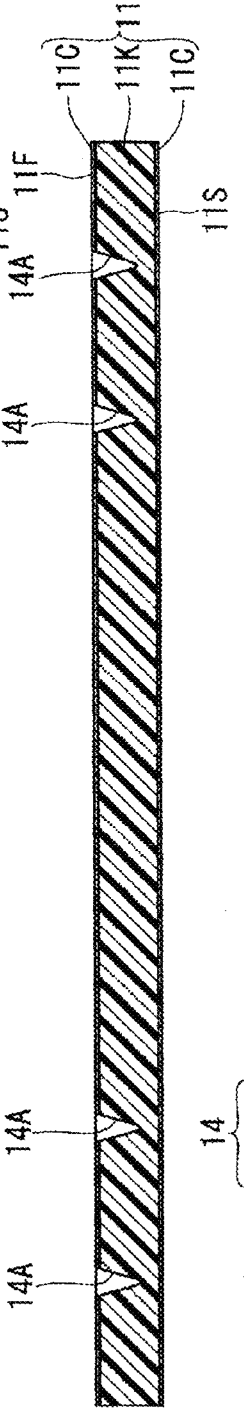

(2) As illustrated in FIG. 4B, the tapered holes (14A) for forming the electrical conduction through holes 14 (see FIG. 3) are drilled by irradiating, for example, CO2 laser to the core substrate 11 from the F surface (11F) side.

Figure 4C:
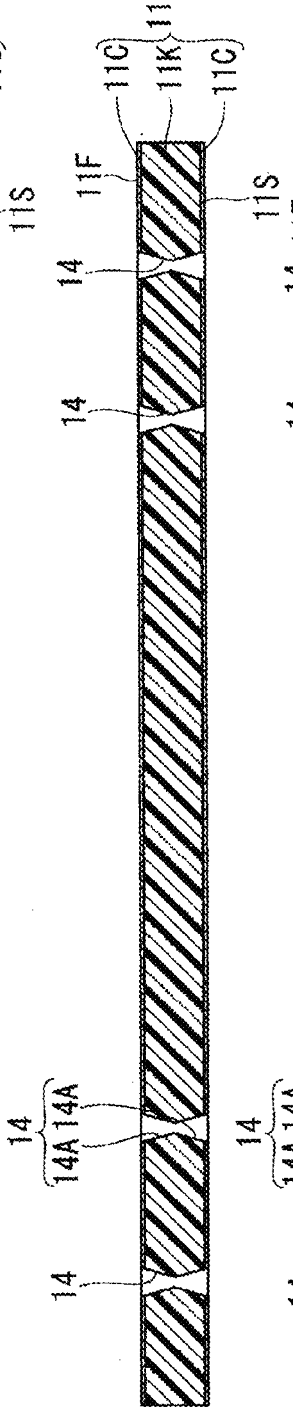

(3) As illustrated in FIG. 4C, the tapered holes (14A) are drilled on the S surface (11S) side of the core substrate 11 by irradiating CO2 laser to positions directly on the back of the above-described tapered holes (14A) on the F surface (11F) side. The electrical conduction through holes 14 are formed from the tapered holes (14A, 14A).

(4) An electroless plating treatment is performed. An electroless plating film (not illustrated in the drawings) is formed on the copper foil (11C) and on inner surfaces of the electrical conduction through holes 14.

Figure 4D:
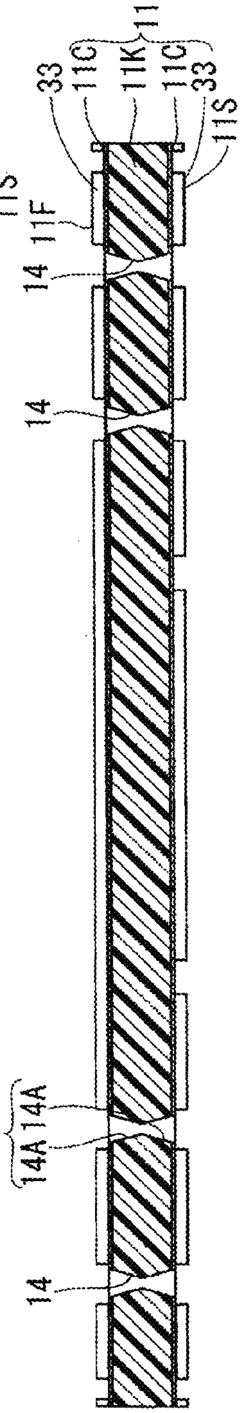

(5) As illustrated in FIG. 4D, a plating resist 33 of a predetermined pattern is formed on the electroless plating film on the copper foil (11C).

Figures 5A, 5B, 5C, 5D:
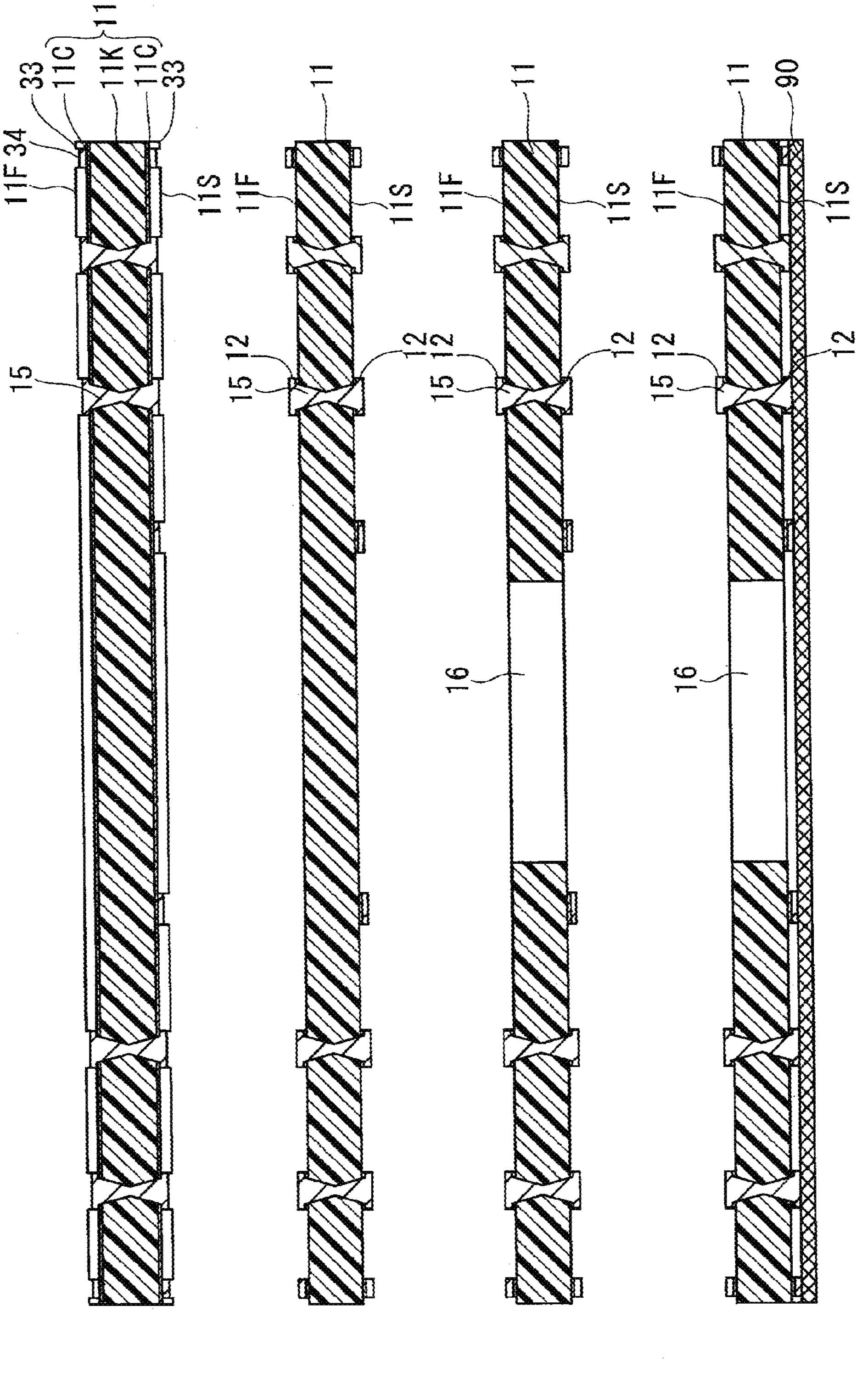
FIG. 5A-5D are cross-sectional side views illustrating manufacturing processes of the circuit substrate.

(6) An electrolytic plating treatment is performed. As illustrated in FIG. 5A, the electrical conduction through holes 14 are filled with electrolytic plating and the through-hole electrical conductors 15 are formed; and an electrolytic plating film 34 is formed on a portion of the electroless plating film (not illustrated in the drawings) on the copper foil (11C), the portion being exposed from the plating resist 33.

(7) The plating resist 33 is peeled off, and the electroless plating film (not illustrated in the drawings) and the copper foil (11C), which are below the plating resist 33, are removed. As illustrated in FIG. 5B, by the remaining electrolytic plating film 34, electroless plating film and copper foil (11C), the conductor circuit layer 12 is formed on the F surface (11F) of the core substrate 11, and the conductor circuit layer 12 is formed on the S surface (11S) of the core substrate 11. Then, the conductor circuit layer 12 on the F surface (11F) and the conductor circuit layer 12 on the S surface (11S) are in a state of being connected by the through-hole electrical conductors 15.

(8) As illustrated in FIG. 5C, the cavity 16 is formed in the core substrate 11 using a router or CO2 laser.

(9) As illustrated in FIG. 5D, a tape 90 made of a PET film is affixed to the S surface (11S) of the core substrate 11 so as to close the cavity 16.

(10) The metal block 17 is prepared. The metal block 17 is formed by cutting a copper plate or a copper block. In a state of being accommodated in a container having an acid resistant mesh structure, the metal block 17 is immersed in an acid solution (for example, an acid of which main components are sulfuric acid and hydrogen peroxide) stored in a storage tank and thereafter is washed with water. As a result, the entire surface of the metal block 17 becomes a roughened surface.

Figure 6A:
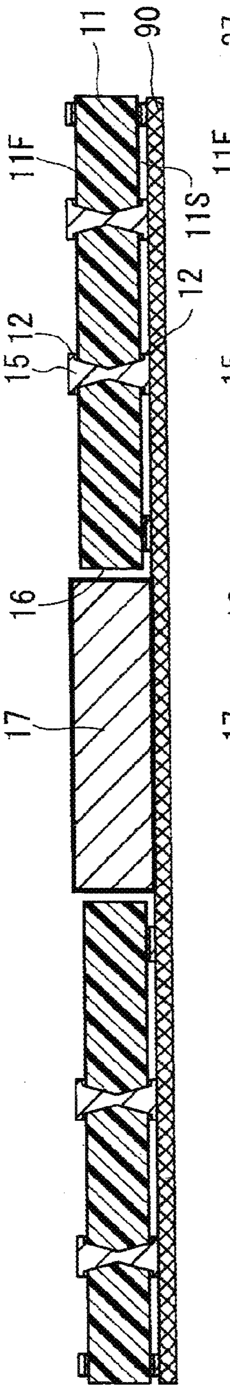
FIG. 6A-6D are cross-sectional side views illustrating manufacturing processes of the circuit substrate.

(11) As illustrated in FIG. 6A, the metal block 17 is accommodated in the cavity 16 using a mounter (not illustrated in the drawings).

Figure 6B:
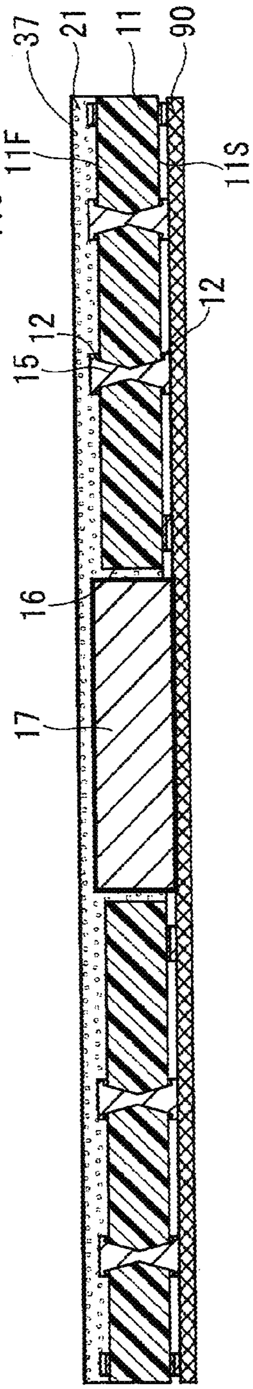

(12) As illustrated in FIG. 6B, a prepreg (a resin sheet of a B-stage formed by impregnating a core material with resin) as the first insulating resin layer 21 and a copper foil 37 are laminated on the conductor circuit layer 12 on the F surface (11F) of the core substrate 11, and then, the resulting substrate is thermo-pressed. In doing so, spacing between the conductor circuit layers (12, 12) on the F surface (11F) of the core substrate 11 is filled with the prepreg, and a gap between an inner surface of the cavity 16 and the metal block 17 is filled with thermosetting resin exuded from the prepreg.

Figure 6C:
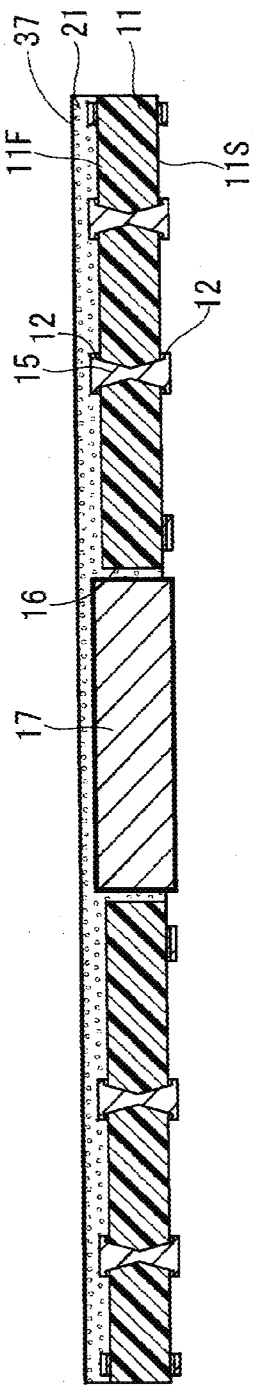

(13) As illustrated in FIG. 6C, the tape 90 is removed.

Figure 6D:
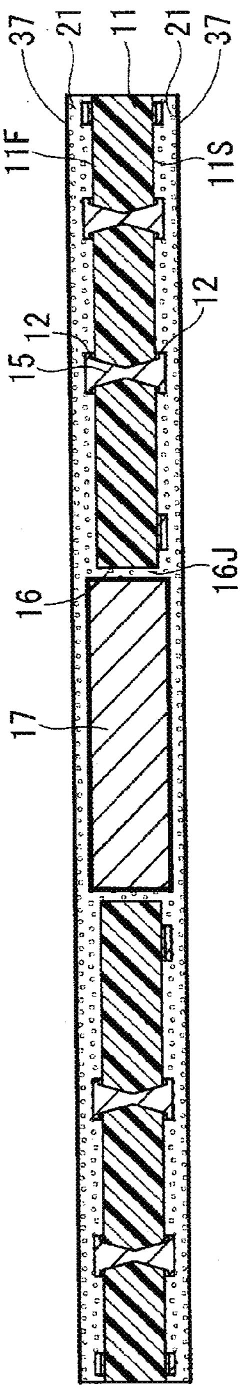

(14) As illustrated in FIG. 6D, a prepreg as the first insulating resin layer 21 and a copper foil 37 are laminated on the conductor circuit layer 12 on the S surface (11S) of the core substrate 11, and then, the resulting substrate is thermo-pressed. In doing so, spacing between the conductor circuit layers (12, 12) on the S surface (11S) of the core substrate 11 is filled with the prepreg, and a gap between the inner surface of the cavity 16 and the metal block 17 is filled with thermosetting resin exuded from the prepreg. Further, the above-described filling resin (16J) is formed by the thermosetting resin that exudes from the prepregs on the F surface (11F) and the S surface (11S) of the core substrate 11 and is filled in the gap between the inner surface of the cavity 16 and the metal block 17.

Instead of the prepreg, it is also possible to use a resin film that does not contain a core material as the first insulating resin layer 21. In this case, without laminating a copper foil, a conductor circuit layer can be directly formed on a surface of the resin film using a semi-additive method.

Figure 7A:
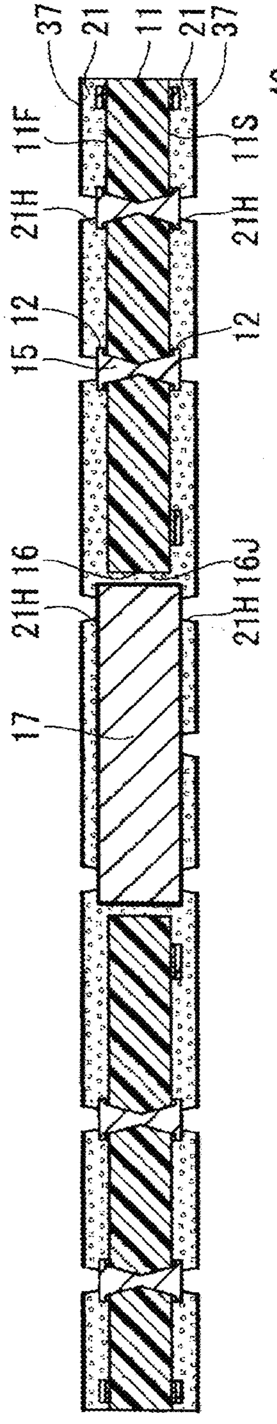
FIG. 7A-7C are cross-sectional side views illustrating manufacturing processes of the circuit substrate.

(15) As illustrated in FIG. 7A, the via holes (21H) are formed by irradiating CO2 laser to the first insulating resin layers (21, 21) that are respectively formed on the front and back sides of the core substrate 11 by the prepregs. Among the via holes (21H), some via holes (21H) are arranged on the conductor circuit layers 12 and other via holes (21H) are arranged on the metal block 17. When the via holes (21H) are formed on the metal block 17, unevenness of the roughened surface of the metal block 17 positioned on a deep side of the via holes (21H) may be eliminated by laser irradiation or by desmear after laser irradiation.

(16) An electroless plating treatment is performed. Electroless plating films (not illustrated in the drawings) are formed on the first insulating resin layers (21, 21) and in the via holes (21H, 21H).

Figure 7B:
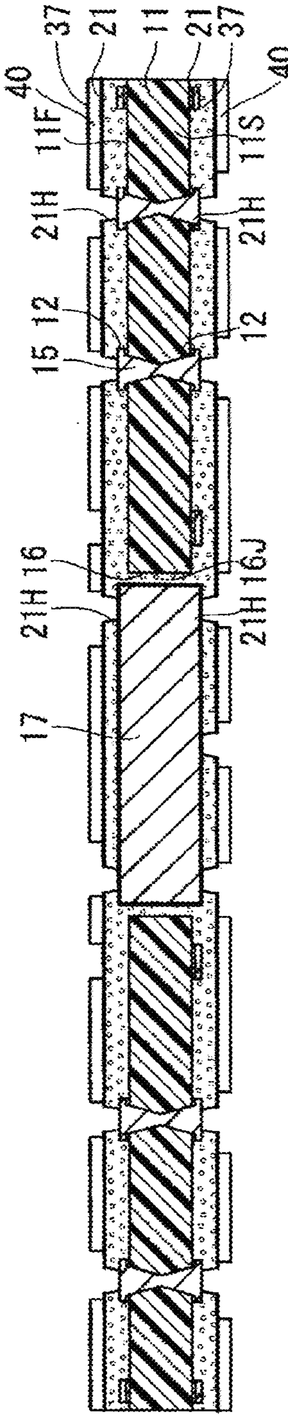

(17) As illustrated in FIG. 7B, plating resists 40 of predetermined patterns are respectively formed on the electroless plating films on the copper foils 37.

Figure 7C:
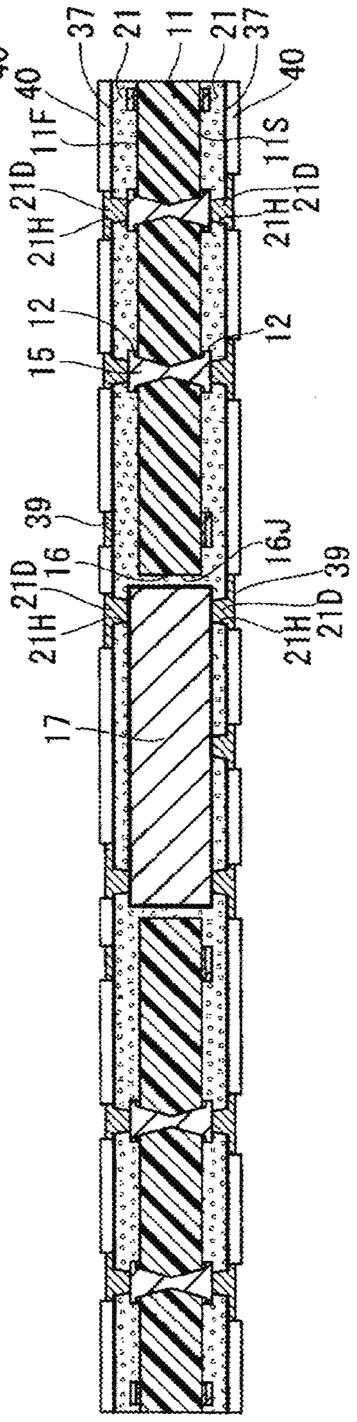

(18) An electrolytic plating treatment is performed. As illustrated in FIG. 7C, the via holes (21H, 21H) are filled with plating and the via conductors (21D, 21D) are formed. Further, electrolytic plating films (39, 39) are formed on portions of the electroless plating films (not illustrated in the drawings) on the first insulating resin layers (21, 21), the portions being exposed from the plating resists 40.

Figure 8A:
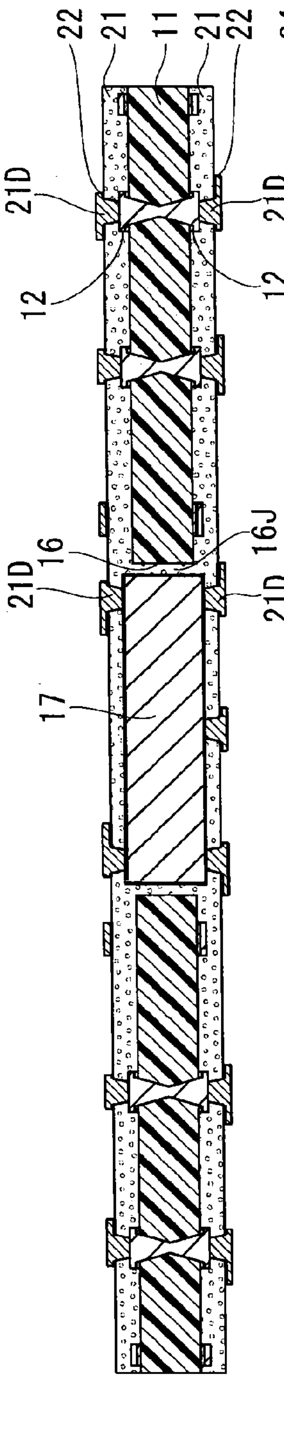
FIG. 8A-8C are cross-sectional side views illustrating manufacturing processes of the circuit substrate.

(19) The plating resists 40 are removed, and the electroless plating films (not illustrated in the drawings) and the copper foils 37, which are below the plating resists 40, are removed. As illustrated in FIG. 8A, the first conductor layers 22 are respectively formed on the first insulating resin layers 21 on the front and back sides of the core substrate 11 by the remaining electrolytic plating films 39, electroless plating films and copper foils 37. Then, a state is achieved in which, on each of the front and back sides of the core substrate 11, a portion of the first conductor layer 22 and the conductor circuit layer 12 are connected by the via conductors (21D), and the other portion of the first conductor layer 22 and the metal block 17 are connected by the via conductors (21D).

Figure 8B:
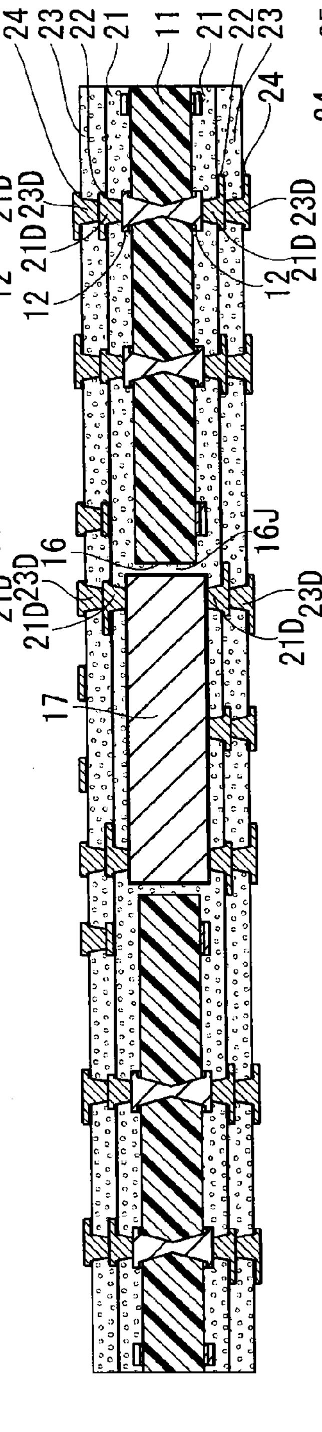

(20) By the same processing as described in the above (12)-(19), as illustrated in FIG. 8B, a state is achieved in which, on each of the front and back sides of the core substrate 11, the second insulating resin layer 23 and the second conductor layer 24 are formed on the first conductor layer 22, and a portion of the second conductor layer 24 and the first conductor layer 22 are connected by the via conductors (23D).

Figure 8C:
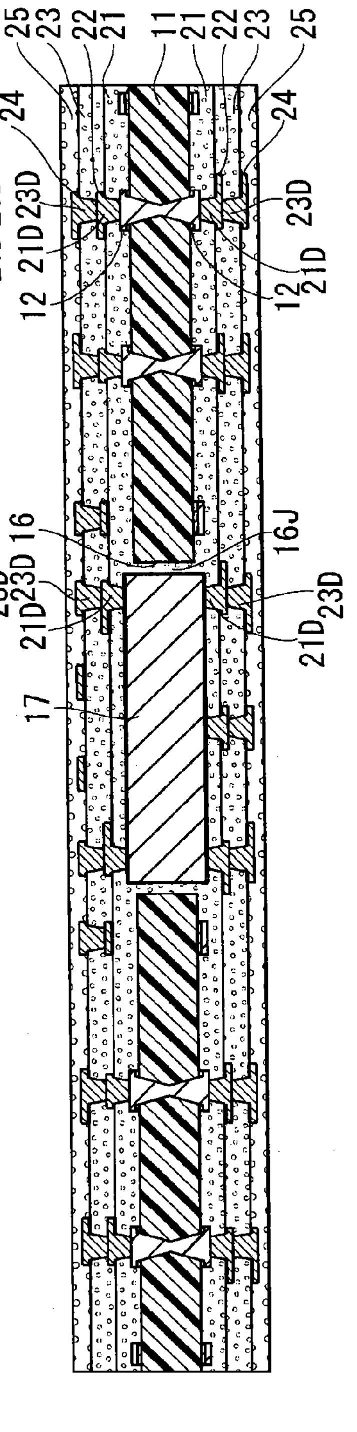

(21) As illustrated in FIG. 8C, the solder resist layers (25, 25) are respectively laminated on the second conductor layers 24 on the front and back sides of the core substrate 11.

Figure 9:
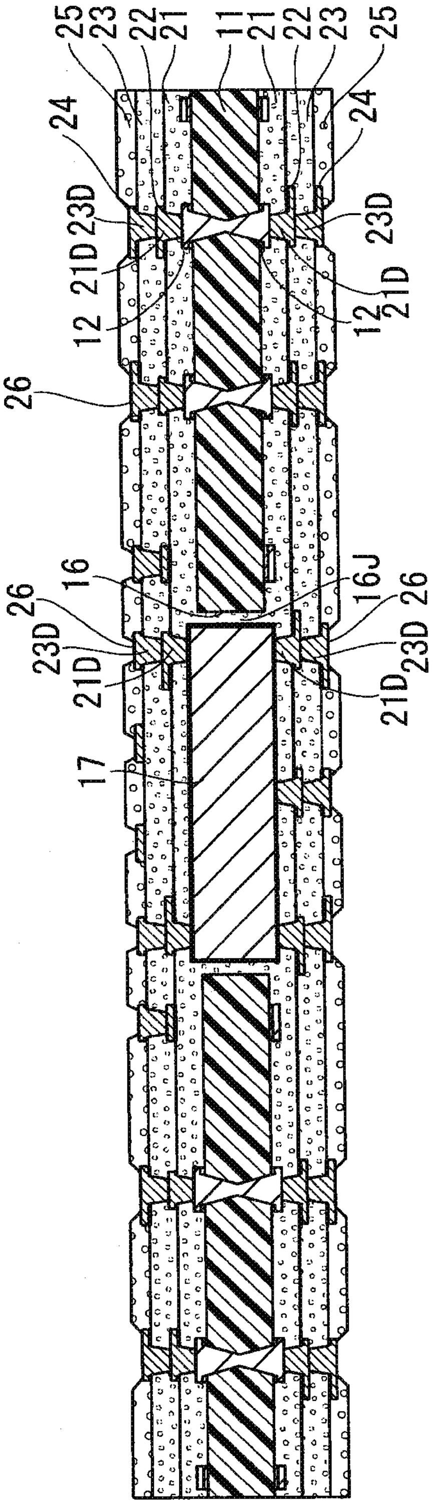
FIG. 9 is a cross-sectional side view illustrating a manufacturing process of the circuit substrate.

(22) As illustrated in FIG. 9, tapered pad holes are formed at predetermined places on the solder resist layers (25, 25) on the front and back sides of the core substrate 11, and portions of the second conductor layers 24 on the front and back sides of the core substrate 11 that are exposed from the pad holes become the pads 26.

(23) On each of the pads 26, a nickel layer, a palladium layer and a gold layer are laminated in this order and a metal film 41 illustrated in FIG. 3 is formed. As a result, the circuit substrate 10 is completed.

Figure 10:
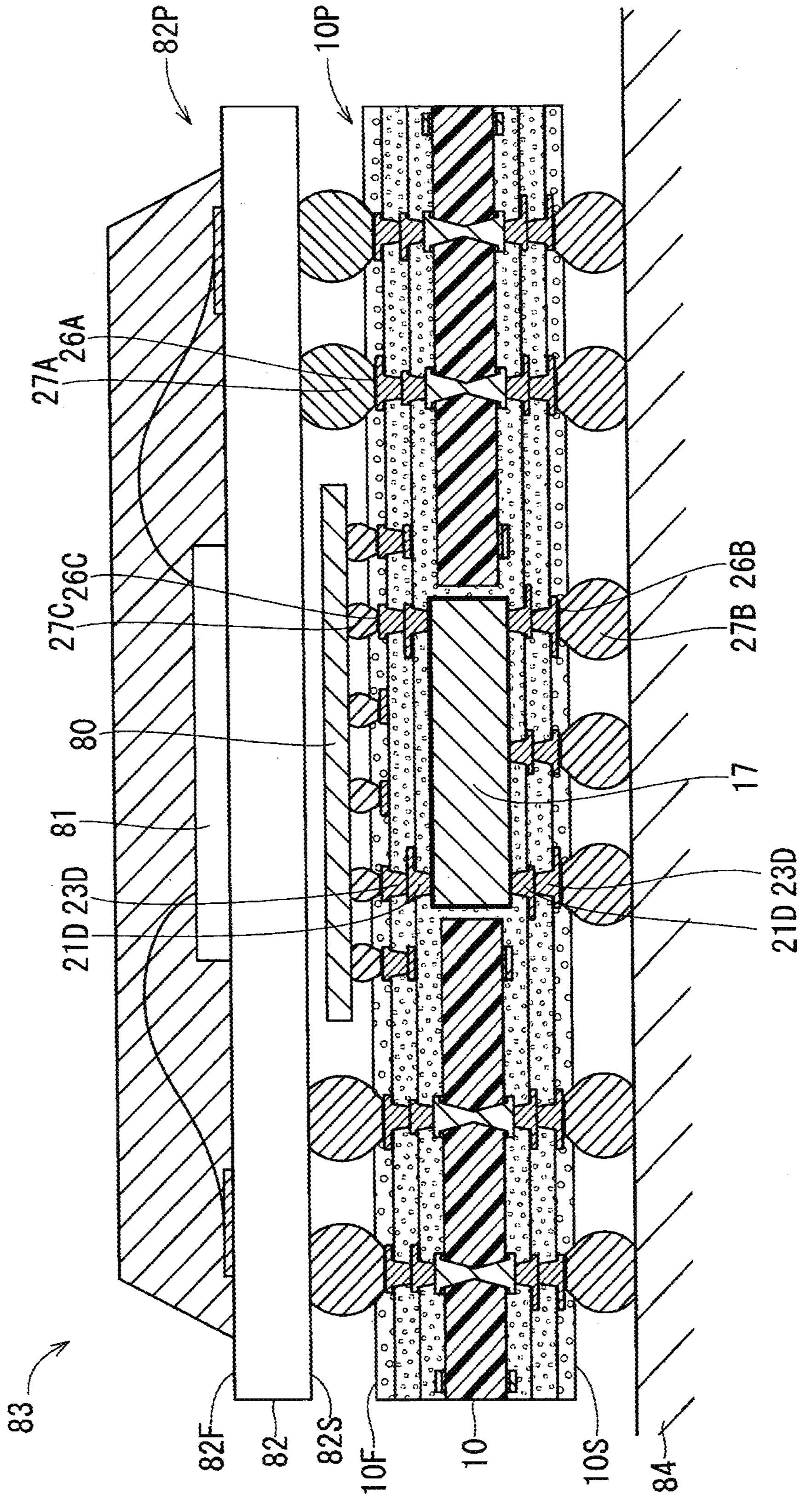
FIG. 10 is a cross-sectional side view of a PoP that includes the circuit substrate.

The description about the structure and the manufacturing method of the circuit substrate 10 of the present embodiment is as given above. Next, an operation effect of the circuit substrate 10 is described together with an example of use of the circuit substrate 10. The circuit substrate 10 of the present embodiment is used, for example, as follows. That is, as illustrated in FIG. 10, large, medium and small solder bumps (27A, 27B, 27C) that respective match the sizes of the above-described large, medium and small pads (26A, 26B, 26C) of the circuit substrate 10 are respectively formed on the large, medium and small pads (26A, 26B, 26C). Then, for example, a CPU 80 having on a lower surface a pad group that is similarly arranged as the small pad group on the F surface (10F) of the circuit substrate 10 is mounted on and soldered to the group of the small solder bumps (27C) of each product region (R2), and a first package substrate (10P) is formed. In this case, for example, two pads for grounding that the CPU 80 has are connected to the metal block 17 of the circuit substrate 10 via the via conductors (21D, 23D).

Next, a second package substrate (82P) that is obtained by mounting a memory 81 on an F surface (82F) of a circuit substrate 82 is arranged from an upper side of the CPU 80 on the first package substrate (10P). The large solder bumps (27A) of the circuit substrate 10 of the first package substrate (10P) are soldered to pads that are provided on an S surface (82S) of the circuit substrate 82 of the second package substrate (82P). Thereby, a PoP 83 (Package on Package 83) is formed. Gaps between the circuit substrates (10, 82) in the PoP 83 are filled with resin (not illustrated in in the drawings).

Next, the PoP 83 is arranged on a motherboard 84. The medium solder bumps (27B) on the circuit substrate 10 of the PoP 83 are soldered to a pad group that the motherboard 84 has. In this case, for example, a pad for grounding that the motherboard 84 has is soldered to a pad 26 of the circuit substrate 10 that is connected to the metal block 17. When the CPU 80 and the motherboard 84 have pads dedicated to heat dissipation, the pads dedicated to heat dissipation and the metal block 17 of the circuit substrate 10 may be connected to each other via the via conductors (21D, 23D).

When the CPU 80 generates heat, the heat is transmitted to the metal block 17 via the via conductors (21D, 23D) contained in the build-up layer 20 on the F surface (10F) side of the circuit substrate 10 on which the CPU 80 is mounted, and is dissipated from the metal block 17 to the motherboard 84 via the via conductors (21D, 23D) contained in the build-up layer 20 on the S surface (10S) side of the circuit substrate 10. Here, in the circuit substrate 10 of the present embodiment, the number of the via conductors (21D) that are connected to the metal block 17 is greater in the build-up layer 20 on the S surface (11S) side, to which the motherboard 84 as a heat dissipation destination is connected, than in the build-up layer 20 on the F surface (10F) side, on which the CPU 80 is mounted. Therefore, heat accumulation in the metal block 17 can be suppressed, and heat dissipation can be efficiently performed.

However, the circuit substrate 10 repeats thermal expansion and contraction due to use and non-use of the CPU 80. Then, due to a difference in thermal expansion coefficients of the metal block 17 and the first insulating resin layer 21 of the build-up layer 20, a shear force acts between the metal block 17 and the first insulating resin layer 21 of the build-up layer 20, and there is a concern that the first insulating resin layer 21 and the via conductors (21D) may peel off from the metal block 17. However, in the circuit substrate 10 of the present embodiment, both the front and back surfaces (the first primary surface (17F) and the second primary surface (17S)) of the metal block 17 that are covered by the first insulating resin layers (21, 21) are formed as roughened surfaces. Therefore, peeling between the metal block 17 and the first insulating resin layers (21, 21) can be suppressed, and the fixation of the metal block 17 in the circuit substrate 10 can be stabilized. Further, the side surfaces (17A) of the metal block 17 are also formed as roughened surfaces. Therefore, fixation of the metal block 17 is also stabilized in a plate thickness direction of the circuit substrate 10. Further, by forming the surfaces of the metal block 17 as roughened surfaces, a contact area between the metal block 17 and the first insulating resin layers (21, 21) and the filling resin (16J) in the cavity 16 is increased, and efficiency of heat dissipation from the metal block 17 to the circuit substrate 10 is increased.

Second Embodiment

Figure 11:
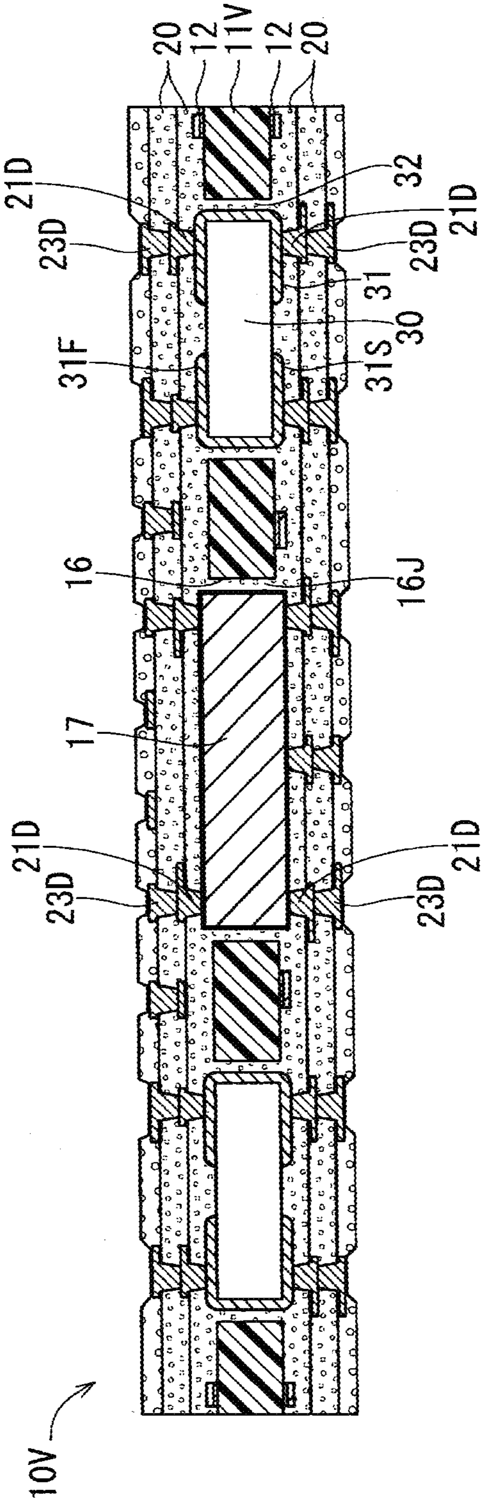
FIG. 11 is a cross-sectional side view of a circuit substrate of a second embodiment.

A circuit substrate (10V) of the present embodiment is illustrated in FIG. 11. In the circuit substrate (10V), cavities 32 that each accommodates a laminated ceramic capacitor 30 are provided near the cavity 16 that accommodates the metal block 17. The laminated ceramic capacitors 30 each have a structure in which, for example, two end portions of a ceramic prismatic body are covered by a pair of electrodes (31, 31). Further, similar to the metal block 17, each of the laminated ceramic capacitors 30 slightly protrudes from the F surface (11F) and the S surface (11S) of a core substrate 11. A first flat surface (31F) of each of the electrodes 31 of the laminated ceramic capacitor 30 is flush with the outermost surface of the conductor circuit layer 12 on the F surface (11F) side of the core substrate 11, and a second flat surface (31S) of each of the electrodes 31 of the laminated ceramic capacitor 30 is flush with the outermost surface of the conductor circuit layer 12 on the S surface (11S) side of the core substrate 11. Then, the via conductors (21D, 23D) contained in the build-up layers (20, 20) on both the front and back surfaces of the core substrate 11 are connected to the electrodes 31 of each of the laminated ceramic capacitors 30. Further, when the circuit substrate (10V) is manufactured, the metal block 17 and the laminated ceramic capacitors 30 are respectively accommodated in the cavities (16, 32) in the same process.

Other Embodiments

The present invention is not limited to the above-described embodiment. For example, an embodiment described below is also included in the technical scope of the present invention. Further, in addition to the embodiment described below, the present invention can also be embodied in various modified forms within the scope without departing from the spirit of the present invention.

(1) The via conductors (21D) of the first and second embodiments are in a state of being connected via the via conductors (23D) to the pads 26 that are exposed from the outermost surfaces of the circuit substrate (10, 10V). However, for example, it is also possible to have a state in which conductors that are connected to the via conductors (21D) are not connected to portions that are exposed from the outermost surfaces of the circuit substrates (10, 10V), such as a state in which the via conductors (23D) are not connected or the pads 26 are not provided.

(2) In the circuit substrates (10, 10V) of the first and second embodiments, the number of the via conductors (21D) that are connected to the metal block 17 is greater in the build-up layer 20 on the S surface (11S) side of the core substrate 11 than in the build-up layer 20 on the F surface (11F) side. However, it is also possible that the number of the via conductors (21D) is greater in the build-up layer 20 on the F surface (11F) side, or the number is the same in the build-up layers 20 on the two sides.

(3) The surfaces of the metal block 17 of the first and second embodiments are roughened after the copper plate or the copper block is cut. However, the surfaces may also be roughened before the cutting. In this case, all the side surfaces or portions of the side surfaces of the metal block 17 are in a state of being not roughened.

(4) The surfaces of the metal blocks of the first and second embodiments are roughened using an acid. However, for example, it is also possible that the roughening of the surfaces is performed by spraying particles or by pressing the surfaces against an uneven surface.

(5) In the second embodiment, a laminated ceramic capacitor 30 is accommodated in each of the cavities 32 in the same process as the metal block 17. However, other than the laminated ceramic capacitors 30, other electronic components, for example, passive components such as capacitors, resistors, thermistors and coils, and active components such as IC circuits, and the like, may also be accommodated in the cavities 32.

In a circuit substrate, there may be a problem that insulating resin layers are peeled off from a metal block so that fixing strength of the metal block is reduced.

A circuit substrate according to an embodiment of the present invention is capable of suppressing peeling of an insulating resin layer from a metal block, and another embodiment of the present invention is a method for manufacturing such a circuit substrate.

A circuit substrate according to one aspect of the present invention includes: a core substrate; a cavity that penetrates through the core substrate; a metal block that is accommodated in the cavity; build-up layers that are respectively laminated on front and back sides of the core substrate and respectively contain insulating resin layers that cover the cavity; and a filling resin that is filled in a gap between the cavity and the metal block. Portions of front and back surfaces of the metal block are formed as roughened surfaces, the front and back surfaces being covered by the build-up layers, and the portions being in contact with resin.

Obviously, numerous modifications and variations of the present invention are possible in light of the above teachings. It is therefore to be understood that within the scope of the appended claims, the invention may be practiced otherwise than as specifically described herein.

What is claimed is:

1. A circuit substrate, comprising:

a core substrate having a cavity penetrating through the core substrate;

a metal block accommodated in the cavity of the core substrate;

a first build-up layer comprising an insulating resin layer and laminated on a first side of the core substrate such that the first build-up layer is covering the cavity on the first side of the core substrate;

a second build-up layer comprising an insulating resin layer and laminated on a second side of the core substrate such that the second build-up layer is covering the cavity on the second side of the core substrate; and a filling resin filling a gap formed between the cavity and the metal block positioned in the cavity of the core substrate, wherein the metal block has a plurality of roughened surfaces on the first and second sides of the core substrate respectively such that the roughened surfaces are in contact with surfaces of the insulating resin layers in the first and second build-up layers on the first and second sides of the core substrate, respectively, the metal block has a plurality of roughened side surfaces between the roughened surfaces such that the roughened side surfaces are in contact with the filling resin, and the filling resin comprises resin derived from at least one of the insulating resin layers in the first and second build-up layers.

2. A circuit substrate according to claim 1, wherein the plurality of roughened side surfaces has an arithmetic average roughness in a range of from 0.1 μm to 3.0 μm.

3. A circuit substrate according to claim 1, wherein the metal block has the plurality of roughened side surfaces between the roughened surfaces such that the roughened surfaces and roughened side surfaces are forming a continuous roughened surface.

4. A circuit substrate according to claim 3, wherein the plurality of roughened surfaces and the plurality of roughened side surfaces have an arithmetic average roughness in a range of from 0.1 μm to 3.0 μm.

5. A circuit substrate according to claim 1, wherein the plurality of roughened surfaces has an arithmetic average roughness in a range of from 0.1 μm to 3.0 μm.

6. A circuit substrate according to claim 5, further comprising:

an electronic component accommodated in a second cavity of the core substrate; and a second filling resin filling a gap formed between the second cavity and the electronic component positioned in the second cavity of the core substrate, wherein the second cavity of the core substrate is penetrating through the core substrate.

7. A circuit substrate according to claim 1, wherein the plurality of roughened surfaces is formed by eroding a plurality of surfaces of the metal block with an acid.

8. A circuit substrate according to claim 1, further comprising:

an electronic component accommodated in a second cavity of the core substrate; and a second filling resin filling a gap formed between the second cavity and the electronic component positioned in the second cavity of the core substrate, wherein the second cavity of the core substrate is penetrating through the core substrate.

9. A circuit substrate according to claim 1, further comprising:

a first via conductor structure formed in the insulating resin layer in the first build-up layer; and a second via conductor structure formed in the insulating resin layer in the second build-up layer, wherein the first build-up layer has an electronic component mounting portion configured to mount an electronic component on a surface of the first build-up layer, the second build-up layer has a substrate connecting portion configured to mount a second circuit substrate on a surface of the second build-up layer, and the second via conductor structure comprises a larger number of via conductors than the first via conductor structure.

10. A circuit substrate according to claim 9, wherein the plurality of roughened surfaces and the plurality of roughened side surfaces have an arithmetic average roughness in a range of from 0.1 μm to 3.0 μm.

11. A circuit substrate according to claim 1, further comprising:

a plurality of through-hole electrical conductors formed through the core substrate, wherein the resin of the filling resin comprises a thermosetting resin derived from at least one of the insulating resin layers in the first and second build-up layers.

12. A circuit substrate according to claim 1, further comprising:

a first via conductor structure formed in the insulating resin layer in the first build-up layer such that the first via conductor structure includes a plurality of first via conductors in contact with the roughened surface on the first side of the core substrate; and a second via conductor structure formed in the insulating resin layer in the second build-up layer such that the second via conductor structure includes a plurality of second via conductors in contact with the roughened surface on the second side of the core substrate, wherein the first build-up layer has an electronic component mounting portion configured to mount an electronic component on a surface of the first build-up layer, and the second build-up layer has a substrate connecting portion configured to mount a second circuit substrate on a surface of the second build-up layer.

13. A method for manufacturing a circuit substrate, comprising:

forming a cavity in a core substrate such that the cavity penetrates through the core substrate;

accommodating a metal block in the cavity of the core substrate;

filling a filling resin into a gap formed between the cavity and the metal block such that the metal block is positioned in the cavity of the core substrate;

forming a first build-up layer comprising an insulating resin layer on a first side of the core substrate such that the first build-up layer covers the cavity on the first side of the core substrate; and forming a second build-up layer comprising an insulating resin layer on a second side of the core substrate such that the second build-up layer covers the cavity on the second side of the core substrate, wherein the metal block has a plurality of roughened surfaces on the first and second sides of the core substrate respectively such that the roughened surfaces are in contact with surfaces of the insulating resin layers in the first and second build-up layers on the first and second sides of the core substrate, respectively, the metal block has a plurality of roughened side surfaces between the roughened surfaces such that the roughened side surfaces are in contact with the filling resin, and the filling resin comprises resin derived from at least one of the insulating resin layers in the first and second build-up layers.

14. A method for manufacturing a circuit substrate according to claim 13, wherein the plurality of roughened side surfaces has an arithmetic average roughness in a range of from 0.1 μm to 3.0 μm.

15. A method for manufacturing a circuit substrate according to claim 13, wherein the metal block has the plurality of roughened side surfaces between the roughened surfaces such that the roughened surfaces and roughened side surfaces are forming a continuous roughened surface.

16. A method for manufacturing a circuit substrate according to claim 13, wherein the plurality of roughened surfaces has an arithmetic average roughness in a range of from 0.1 μm to 3.0 μm.

17. A method for manufacturing a circuit substrate according to claim 13, further comprising:

eroding a plurality of surfaces of the metal block with an acid such that the plurality of roughened surfaces is formed.

18. A method for manufacturing a circuit substrate according to claim 13, further comprising:

forming a second cavity in the core substrate such that the second cavity is penetrating through the core substrate;

accommodating an electronic component in the second cavity of the core substrate; and filling a second filling resin into a gap formed between the second cavity and the electronic component such that the electronic component is positioned in the second cavity of the core substrate.

19. A method for manufacturing a circuit substrate according to claim 13, further comprising:

forming a first via conductor structure in the insulating resin layer in the first build-up layer;

forming a second via conductor structure in the insulating resin layer in the second build-up layer;

forming an electronic component mounting portion configured to mount an electronic component on a surface of the first build-up layer; and forming a substrate connecting portion configured to mount a second circuit substrate on a surface of the second build-up layer, wherein the forming of the second via conductor structure comprises forming the second via conductor structure comprising a larger number of via conductors than the first via conductor structure.

20. A method for manufacturing a circuit substrate according to claim 13, further comprising:

forming a plurality of through-hole electrical conductors such that the through-hole electrical conductors penetrate through the core substrate, wherein the filling of the filling resin comprises deriving the resin comprising a thermosetting resin from at least one of the insulating resin layers in the first and second build-up layers.

* * * * *